US012444553B2

(12) United States Patent
Kuo

(10) Patent No.: US 12,444,553 B2
(45) Date of Patent: Oct. 14, 2025

(54) ELECTRONIC DEVICE AND BUTTON MODULE THEREOF

(71) Applicant: CHICONY ELECTRONICS CO., LTD., New Taipei (TW)

(72) Inventor: Lun-Hung Kuo, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 127 days.

(21) Appl. No.: 18/358,514

(22) Filed: Jul. 25, 2023

(65) Prior Publication Data

US 2024/0234047 A1 Jul. 11, 2024

(30) Foreign Application Priority Data

Jan. 10, 2023 (TW) ................................ 112101071

(51) Int. Cl.
*H01H 13/06* (2006.01)
*H01H 13/14* (2006.01)
*H05K 5/00* (2025.01)

(52) U.S. Cl.
CPC ............ *H01H 13/06* (2013.01); *H01H 13/14* (2013.01); *H05K 5/0017* (2013.01)

(58) Field of Classification Search
CPC ........... H01H 2013/00; H01H 2013/02; H01H 2013/04; H01H 2013/06; H01H 2013/50; H01H 2013/52; H01H 2223/00; H01H 2223/002; H01H 2223/003; H01H 2223/034; H01H 2223/044; H01H 9/00; H01H 9/02; H01H 9/04; H01H 2003/12; H01H 2003/02; H01H 2003/04; H01H 2003/048; H01H 1/64; H01H 3/12; H01H 13/00; H01H 13/04; H01H 13/06; H01H 13/063; H01H 13/14; H01H 13/50; H01H 13/52; H05K 5/0017; H05K 5/00
USPC ........................................................ 200/341
See application file for complete search history.

(56) References Cited

U.S. PATENT DOCUMENTS

| | | | |
|---|---|---|---|
| 8,263,886 B2 | 9/2012 | Lin et al. | |
| 9,455,102 B2 * | 9/2016 | Takahashi .............. | H01H 13/06 |
| 2020/0152401 A1 | 5/2020 | Huang et al. | |

FOREIGN PATENT DOCUMENTS

| | | |
|---|---|---|
| TW | I380333 B | 12/2012 |
| TW | I669045 B | 8/2019 |

* cited by examiner

*Primary Examiner* — Anthony R Jimenez
(74) *Attorney, Agent, or Firm* — MUNCY, GEISSLER, OLDS & LOWE, P.C.

(57) ABSTRACT

A button module is applied to an electronic device. The electronic device includes a casing. The button module includes a circuit board, a pressing member, a waterproof member and a reinforced member. The circuit board is disposed in the casing. The circuit board includes a switch element. The pressing member disposed on a mounting opening of the casing. The waterproof member includes a fixing flange and a first surface and a second surface opposite to each other. The first surface faces the pressing member, and the second surface faces the circuit board. The fixing flange connects to the casing. The reinforced member is disposed on the second surface of the waterproof member, and an edge of the pressing member corresponds to the reinforced member. The reinforced member includes an opening corresponding to the switch element.

20 Claims, 6 Drawing Sheets

ELECTRONIC DEVICE AND BUTTON MODULE THEREOF

CROSS-REFERENCE TO RELATED APPLICATION

This application claims the priority benefit of Taiwan application serial no. 112101071, filed on Jan. 10, 2023. The entirety of the above-mentioned patent application is hereby incorporated by reference herein and made a part of this specification.

BACKGROUND

1. Technical Field

The present disclosure relates to a button module, and particularly to a button module of a doorbell device.

2. Description of the Related Art

At present, many electronic devices are applied in outdoor spaces, and the functionality of common outdoor devices is increased. The electronic components and the circuit board of the electronic device are usually disposed inside thereof. The conventional doorbell device (i.e., an electronic device) can have a number of additional functions, such as motion sensing, image capturing and other functions. Therefore, the interior of the electronic device also has some electronic components corresponding to those functions, and these electronic components are usually disposed on the circuit board.

In order to prevent the exterior moisture from entering an electronic device (e.g., a doorbell device) through the gaps between a button and a casing of the electronic device, a waterproof rubber member is generally provided inside the button and located between the button and a circuit board. Thus, entry of the water and moisture can be prevented by the waterproof rubber member and damage to the internal circuit board can be avoided.

However, most of the conventional electronic devices have not improved the structural strength of the button for anti-theft or other purposes. Therefore, the conventional electronic devices cannot resist damage caused by an external force destroying the button. Specifically, a bottom side of the button corresponds to the circuit board to trigger a switch element on the circuit board. Even though the waterproof rubber member is located between the button and the circuit board, the impact force transmitted to the bottom side of the button when the button is damaged by force (e.g., the button is peened) cannot be blocked by the waterproof rubber member. Thus, damage to the circuit board and the electronic device cannot be avoided.

SUMMARY

In view of the aforesaid issues, the main object of the disclosure is to provide an electronic device and a button module thereof, wherein a reinforced member of the button module is used to solve the lack of impact resistance of the button of a conventional outdoor electronic device.

To achieve the above object, the disclosure provides a button module applied to an electronic device. The electronic device comprises a casing. The button module comprises a circuit board, a pressing member, a waterproof member and a reinforced member. The circuit board is disposed in the casing. The circuit board comprises a switch element. The pressing member is disposed on a mounting opening of the casing. The waterproof member comprises a fixing flange and a first surface and a second surface opposite to each other. The first surface faces the pressing member, and the second surface faces the circuit board. The fixing flange connects to the casing. The reinforced member is disposed on the second surface of the waterproof member, and an edge of the pressing member corresponds to the reinforced member. The reinforced member comprises an opening corresponding to the switch element.

To achieve the above object, the disclosure further provides an electronic device, which comprises a casing and a button module. The casing comprises a mounting opening and an inner surface. The button module comprises a circuit board, a pressing member, a waterproof member and a reinforced member. The circuit board is disposed in the casing. The circuit board comprises a switch element. The pressing member is disposed on the mounting opening. The waterproof member comprises a fixing flange, and a first surface and a second surface opposite to each other. The first surface faces the pressing member, and the second surface faces the circuit board. The fixing flange connects to the casing. The reinforced member is disposed on the second surface of the waterproof member, and an edge of the pressing member corresponds to the reinforced member. The reinforced member comprises an opening corresponding to the switch element.

According to an embodiment of the disclosure, when the pressing member is pressed, the edge of the pressing member is restricted by the reinforced member.

According to an embodiment of the disclosure, a portion of the waterproof member passes through the opening and touches the switch element.

According to an embodiment of the disclosure, an orthographic projection area of the pressing member projected onto the reinforced member is less than an area of the reinforced member.

According to an embodiment of the disclosure, the pressing member further comprises a limiting portion disposed on the edge of the pressing member. The limiting portion corresponds to the reinforced member, and the limiting portion abuts an inner edge of the mounting opening.

According to an embodiment of the disclosure, the reinforced member stops the limiting portion of the pressing member when the pressing member is pressed.

According to an embodiment of the disclosure, the waterproof member further comprises a restoring structure. The restoring structure protrudes toward the pressing member and is located inside the fixing flange.

According to an embodiment of the disclosure, the waterproof member further comprises a pressing portion, which is disposed on the restoring structure and located on the second surface. The pressing portion triggers the switch element when the pressing member is pressed.

According to an embodiment of the disclosure, the pressing member further comprises a propped portion disposed on one side of the waterproof member facing toward the pressing member, and the propped portion corresponds to the switch element.

According to an embodiment of the disclosure, the reinforced member further comprises a plurality of fixing portions. The fixing portions connect to the casing.

According to an embodiment of the disclosure, the fixing portions are symmetrically disposed on the reinforced member.

According to an embodiment of the disclosure, the fixing flange protrudes from the first surface.

According to an embodiment of the disclosure, the reinforced member comprises a metal material.

In continuation of the description above, according to the electronic device and the button module thereof of the present disclosure, the reinforced member is disposed on one surface (i.e., the second surface) of the waterproof member and an edge of the pressing member corresponds to the reinforced member such that the reinforced member is able to restrict the position of the pressing member when the pressing member is pressed. Even if the electronic device is damaged by an external force, such as the pressing member being peened, the reinforced member disposed between the pressing member and the circuit board would bear the downward stress from the pressing member so as to prevent excessive pressure from being applied to the fragile circuit board, thereby protecting the circuit board and the switch element thereof.

DETAILED DESCRIPTION OF THE EMBODIMENTS

Figure 1:
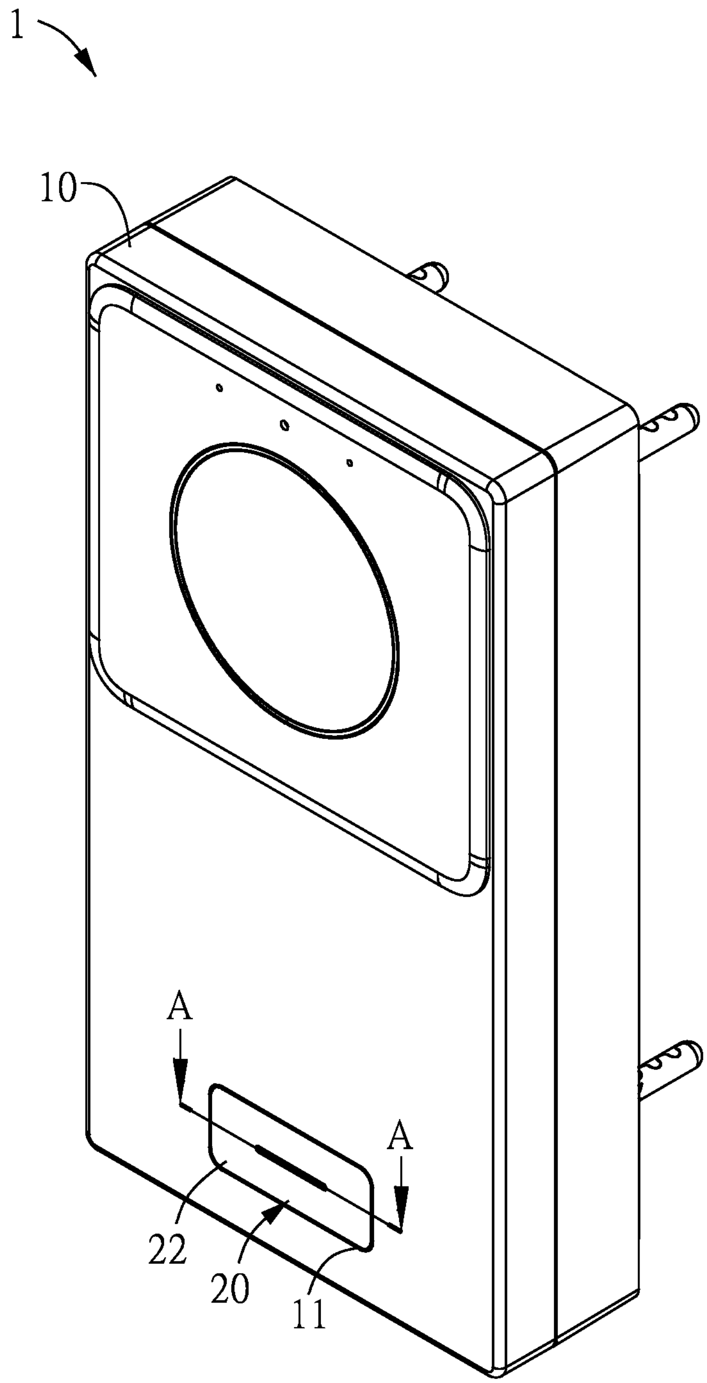
FIG. 1 is a schematic diagram of an electronic device according to an embodiment of the disclosure.

In order to make the structure, characteristics, and effectiveness of the disclosure further understood and recognized, a detailed description of the disclosure is provided as follows, along with embodiments and accompanying figures. The described specific embodiments are to be used for purposes of explanation only, and not as a restriction of the disclosure. The descriptions of structural operations are not intended to restrict the order of processing steps, and any devices with equivalent functions provided by combination of other elements should be construed to fall within the scope of the disclosure as hereinafter claimed. In addition, the drawings omit some elements to clearly show the technical features of the present disclosure. In the drawings, the same reference numerals denote the same or similar elements throughout.

Figure 2:
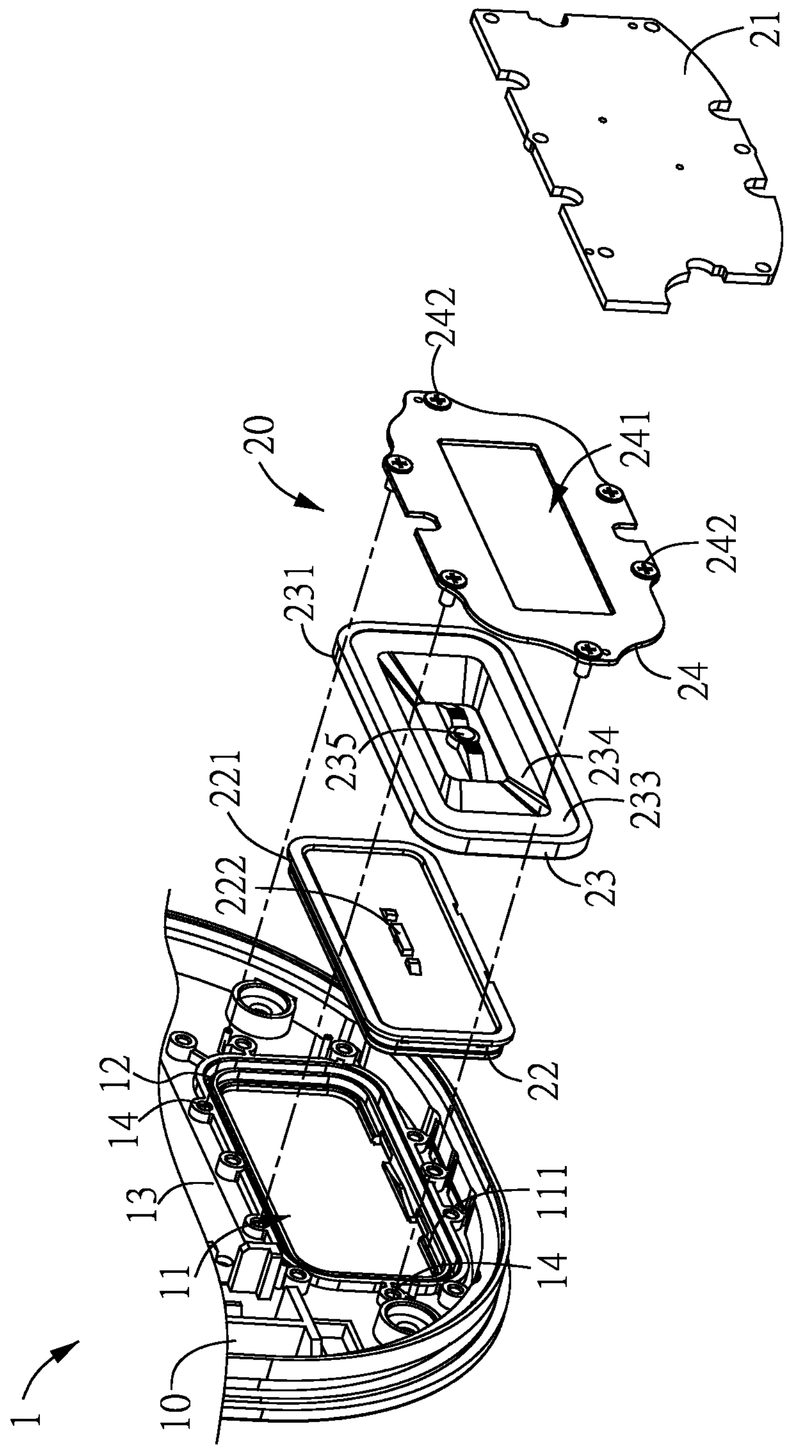
FIG. 2 is an exploded view of a button module shown in FIG. 1.

FIG. 1 is a schematic diagram of an electronic device according to an embodiment of the disclosure, and FIG. 2 is an exploded view of a button module shown in FIG. 1. Refer to FIG. 1 and FIG. 2. The electronic device 1 is an outdoor device; for example, the electronic device 1 of this embodiment is a doorbell device mounted in an outdoor space. The electronic device 1 comprises a casing 10 and a button module 20. In this embodiment, the casing 10 mainly refers to a front cover of the electronic device 1, and the casing 10 is used for installing the button module 20. The casing 10 comprises a mounting opening 11, a mounting groove 12 and an inner surface 13, as shown in FIG. 2. The mounting groove 12 is located on the inner surface 13 of the casing 10 and surrounds the mounting opening 11. In other words, the mounting groove 12 is disposed along the periphery of the mounting opening 11 such that the mounting groove 12 surrounds the mounting opening 11.

As shown in FIG. 2, the button module 20 of this embodiment comprises a circuit board 21, a pressing member 22, a waterproof member 23 and a reinforced member 24. The circuit board 21 is disposed inside the electronic device 1. Preferably, the circuit board 21 of this embodiment is disposed on the inner surface 13 of the casing 10. The circuit board 21 comprises a switch element 211 (refer to FIG. 4 and FIG. 5 first), and the switch element 211 corresponds in position to the mounting opening 11.

Figure 3:
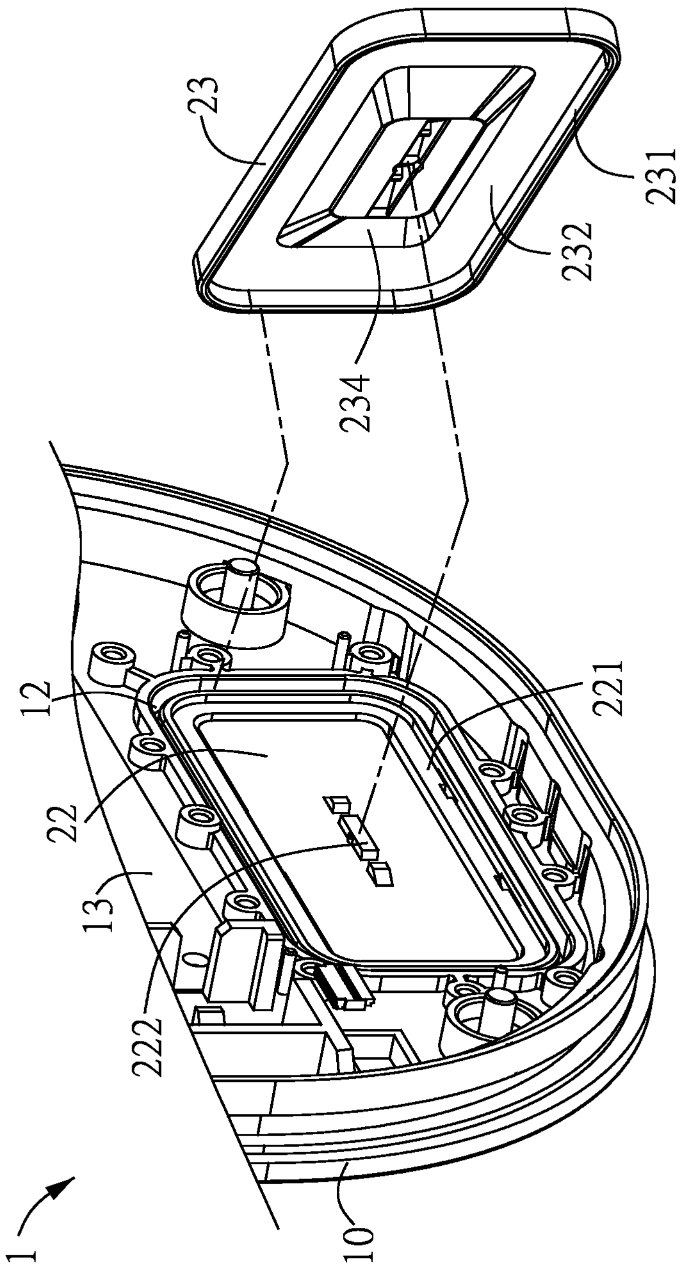
FIG. 3 is a schematic diagram of a pressing member assembled in a casing and a first surface of a waterproof member shown in FIG. 2.

FIG. 3 is a schematic diagram of a pressing member assembled to a casing and a first surface of a waterproof member shown in FIG. 2. Refer to FIG. 2 and FIG. 3. In this embodiment, the pressing member 22 is disposed on the casing 10 and on the mounting opening 11. Preferably, the pressing member 22 comprises a limiting portion 221, which is disposed on the edge of the pressing member 22. When the pressing member 22 is not pressed, the limiting portion 221 abuts an inner edge 111 of the mounting opening 11 (as shown in FIG. 2) to prevent the pressing member 22 from being released from the mounting opening 11. In other words, the pressing member 22 is restricted within the mounting opening 11.

Figure 4:
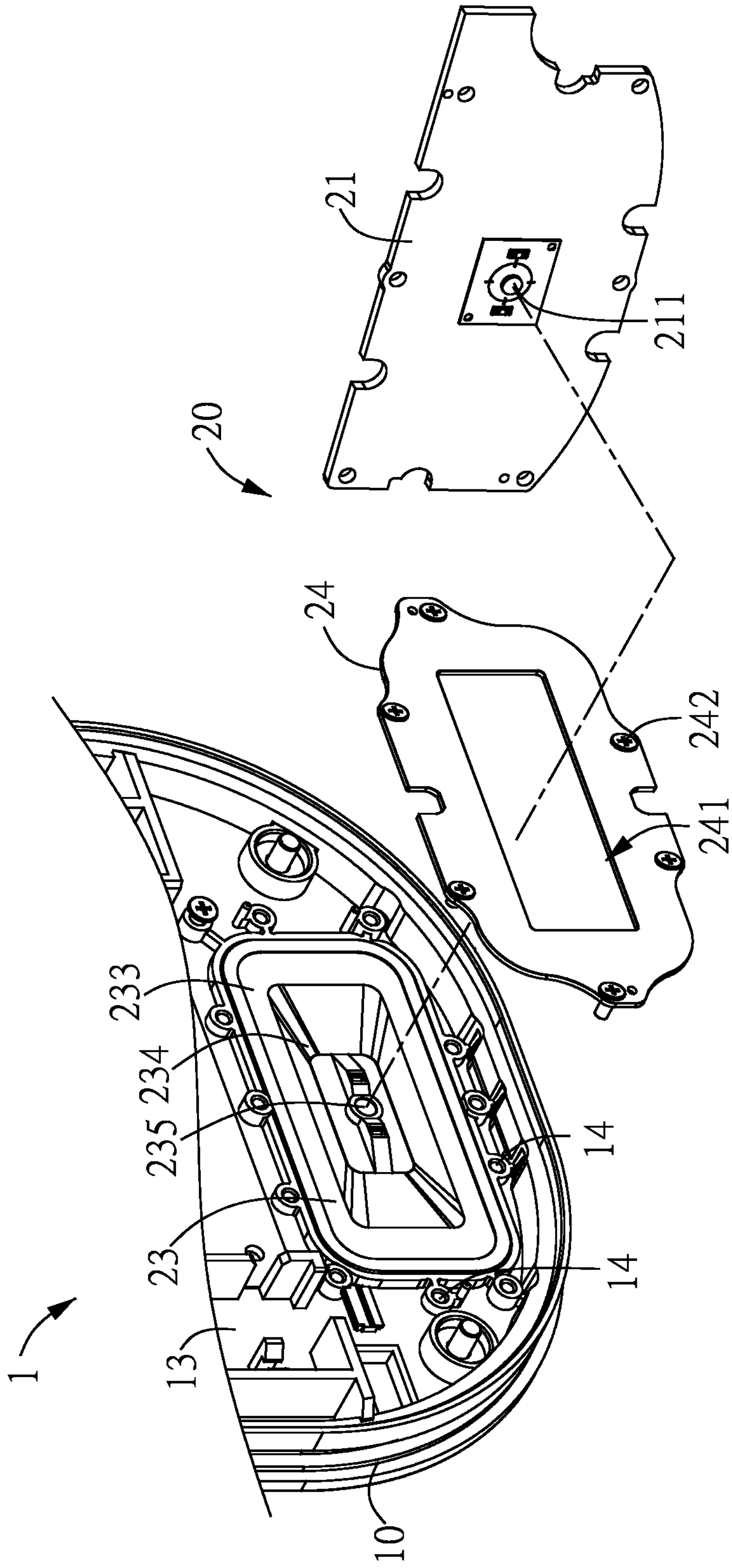
FIG. 4 is a schematic diagram of the pressing member and the waterproof member assembled in the casing shown in FIG. 2.

In this embodiment, the waterproof member 23 comprises a fixing flange 231, a first surface 232 and a second surface 233. The first surface 232 and the second surface 233 are opposite to each other. The first surface 232 faces the pressing member 22, as shown in FIG. 3. The second surface 233 faces the circuit board 21, as shown in FIG. 2. Refer to FIG. 3. The fixing flange 231 preferably protrudes from the first surface 232. That is, the fixing flange 231 protrudes toward the pressing member 22 from the first surface 232. Preferably, the fixing flange 231 is located on the edge of the waterproof member 23. The fixing flange 231 of this embodiment connects to the casing 10. During assembly, the fixing flange 231 is accommodated in the mounting groove 12 of the casing 10 so that the fixing flange 231 can connect to the casing 10, as shown in FIG. 3 and FIG. 4. FIG. 4 is a schematic diagram of the pressing member and the waterproof member assembled in the casing shown in FIG. 2. At this moment, the pressing member 22 is located on the first surface 232 of the waterproof member 23. Because the mounting groove 12 surrounds the mounting opening 11, the waterproof member 23 can cover the mounting opening 11 and the pressing member 22 by accommodating the fixing flange 231 of the waterproof member 23 into the mounting groove 12 of the casing 10. The waterproof member 23 can prevent exterior moisture from entering the electronic device 1 via the gaps between the pressing member 22 and the mounting opening 11 and thereby protect the circuit board 21 disposed in the electronic device 1.

Figure 5:
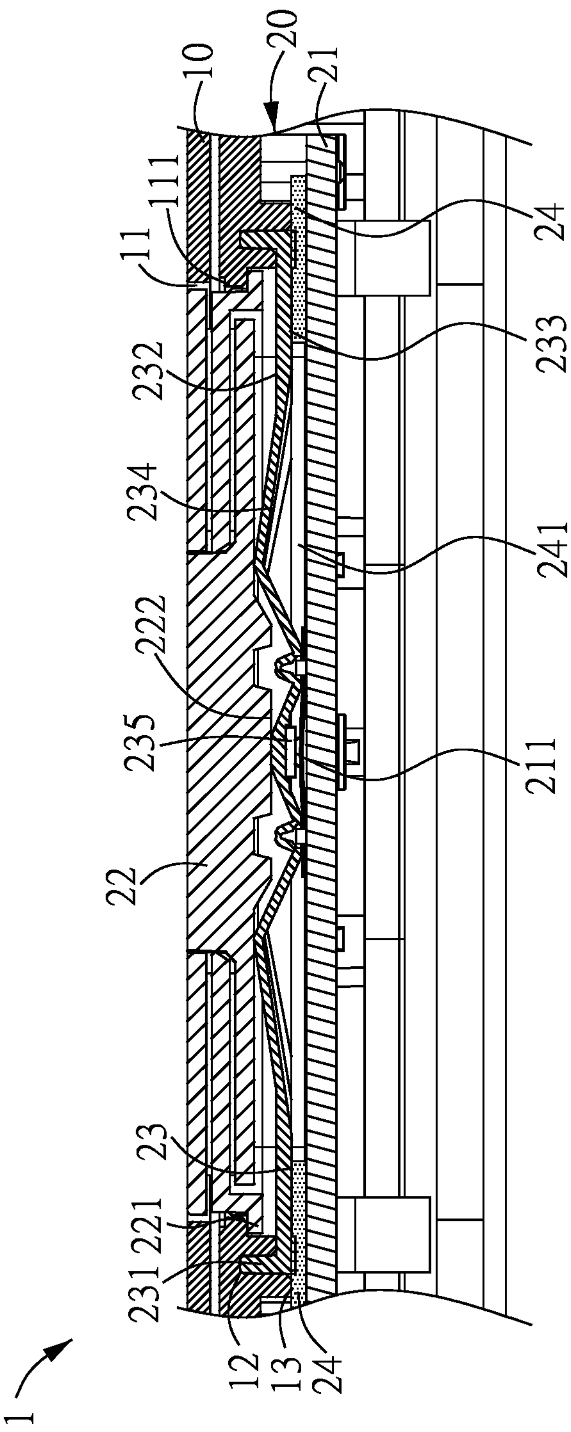
FIG. 5 is a sectional view of the electronic device along the section line A-A shown in FIG. 1.

FIG. 5 is a sectional view of the electronic device along the section line A-A shown in FIG. 1. Refer to FIG. 2, FIG. 4 and FIG. 5. The reinforced member 24 is disposed on the second surface 233 of the waterproof member 23. In this embodiment, the circuit board 21 is disposed on a surface of the reinforced member 24 opposite to the pressing member 22 and the waterproof member 23. In other words, the reinforced member 24 is disposed between the waterproof member 23 and the circuit board 21 such that one side of the reinforced member 24 is toward the pressing member 22 and the waterproof member 23 and the other side of the reinforced member 24 is toward the circuit board 21. Thus, the force exerted on the pressing member 22 will be transmitted to the reinforced member 24 first and will not directly impact the circuit board 21, the details of which will be further described hereinafter.

Furthermore, the reinforced member 24 comprises an opening 241. The opening 241 corresponds to the switch element 211 in position so that a portion of the waterproof member 23 can pass through the opening 241 and touch the switch element 211. In one embodiment, the waterproof member 23 does not touch the switch element 211 when the pressing member 22 is not pressed, and the waterproof member 23 passes through the opening 241 and touches the switch element 211 when the pressing member 22 is pressed. In another embodiment, when the pressing member 22 is not pressed, the waterproof member 23 can touch the switch element 211. That is, the present disclosure does not limit whether the waterproof member 23 passes through the opening 241 or touches the switch element 211 or not when the pressing member 22 is not pressed. The waterproof member 23 only needs to pass through the opening 241 and touch the switch element 211 when the pressing member 22 is pressed to transmit the force from the pressing member 22 to the switch element 211 and trigger the switch element 211.

In addition, an edge of the pressing member 22 corresponds to the reinforced member 24. Specifically, an outer perimeter of the reinforced member 24 is greater than an outer perimeter of the pressing member 22 such that the edge of the pressing member 22 is within the range of the reinforcing piece 24. Thus, the pressing member 22 can be orthographically projected onto the reinforced member 24, and an orthographic projection area of the pressing member 22 projected onto the reinforced member 24 is less than an area of the reinforced member 24 itself. That is, the area of the reinforced member 24 itself is greater than the orthographic projection area of the pressing member 22 projected onto the reinforced member 24. It should be noted that the pressing member 22 of this embodiment is composed of multiple parts. For the sake of conciseness, multiple parts of the pressing member 22 are shown with the same section line in FIG. 5 and FIG. 6.

In this embodiment, the waterproof member 23 and the reinforced member 24 are two independent pieces. Refer to FIG. 2 and FIG. 4. Preferably, the reinforced member 24 further comprises a plurality of fixing portions 242, and the reinforced member 24 connects to the casing 10 by the fixing portions 242. Specifically, after the reinforced member 24 is placed on the second surface 233 of the waterproof member 23 and the opening 241 corresponds in position to the switch element 211, the fixing portions 242 connect to the casing 10. In this embodiment, the fixing portions 242 can be a screw respectively, and the casing 10 comprises a plurality of screw holes 14. The reinforced member 24 is fixed to the casing 10 by screwing the fixing portions 242 (e.g., the screws) into the screw holes 14 of the casing 10, and the reinforced member 24 is located on the second surface 233 of the waterproof member 23. Preferably, the fixing portions 242 are symmetrically disposed on the reinforced member 24 so that the reinforced member 24 can evenly bear the external force.

In another embodiment, the waterproof member 23 and the reinforced member 24 can also be integrally molded into one piece. For example, the waterproof member 23 and the reinforced member 24 are jointly formed by double injection molding or metal insert molding such that the reinforced member 24 is formed on the second surface 233 of the waterproof member 23.

Figure 6:
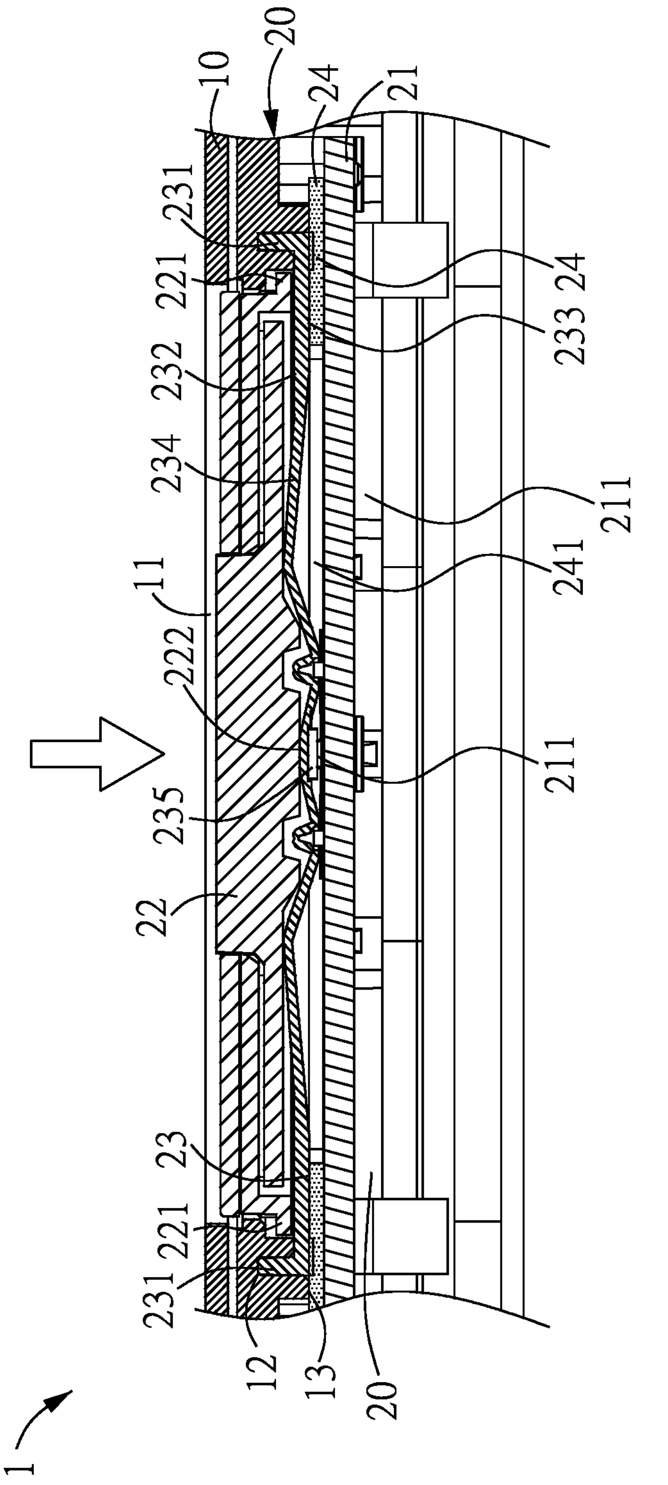
FIG. 6 is a sectional view of the pressing member shown in FIG. 5 being pressed.

FIG. 6 is a sectional view of the pressing member shown in FIG. 5 being pressed. Refer to FIG. 5 and FIG. 6. When the pressing member 22 is pressed, the pressing member 22 moves downward such that at least a portion of the waterproof member 23 moves toward the circuit board 21 and the switch element 211 is triggered by the waterproof member 23. At the same time, the edge of the pressing member 22 is limited by the reinforced member 24 such that the downward movement of the pressing member 22 is limited. Preferably, the edge of the pressing member 22 has a limiting portion 221 corresponding in position to the reinforced member 24. When the pressing member 22 is pressed, the reinforced member 24 stops the limiting portion 221 of the pressing member 22 to limit the position of the pressing member 22. If the electronic device 1 is damaged by an external force, such as the pressing member 22 being peened, the downward stress from the pressing member 22 can be absorbed by the reinforced member 24 to prevent the force from being applied to the fragile circuit board 21, thereby protecting the circuit board 21 and the switch element 211 thereof. Preferably, the reinforced member 24 may be made of a metal material to withstand a greater impact. Testing has shown that the structure of the button module 20 of this embodiment can protect against at least 5 joules of impact, so the button module 20 of this embodiment has an impact protection level of IK08.

In this embodiment, the waterproof member 23 may be made of an elastic rubber material. Thus, when the pressing member 22 is not pressed, the pressing member 22 is restored to its initial position by the elastic material of the waterproof member 23, as shown in FIG. 5. Refer to FIG. 2 and FIG. 3. Preferably, the waterproof member 23 further comprises a restoring structure 234. The restoring structure 234 protrudes toward the pressing member 22 to form a dome-like structure. Because the restoring structure 234 protrudes toward the pressing member 22, a convex structure is formed on the first surface 232 of the waterproof member 23 (as shown in FIG. 3), and a concave structure is formed on the second surface 233 of the waterproof member 23 (as shown in FIG. 2). Furthermore, the restoring structure 234 is located inside the fixing flange 231 and corresponds in position to the opening 241 of the reinforced member 24.

Preferably, the waterproof member 23 further comprises a pressing portion 235, as shown in FIG. 2 and FIG. 4. The pressing portion 235 is disposed on the restoring structure 234, and the pressing portion 235 is located on the second surface 233 such that it corresponds in position to the switch element 211 of the circuit board 21. When the pressing member 22 is pressed, the pressing member 22 presses against the waterproof member 23, the restoring structure 234 of the waterproof member 23 is deformed toward the circuit board 21, and the pressing portion 235 exerts force on the switch element 211 to trigger the switch element 211, as shown in FIG. 6. When the pressing member 22 is not pressed, the waterproof member 23 is restored to its initial structure of protruding toward the pressing member 22 by the restoring structure 234 and the pressing member 22 is restored to its initial position at the same time. The material of the pressing portion 235 is different from the main material of the waterproof member 23 (such as rubber). Preferably, the pressing portion 235 may be made of a harder material, such as plastic. In this embodiment, the pressing portion 235 may be a plastic plate. In another embodiment, the pressing portion 235 may made of other materials whose hardness is greater than that of rubber so as to provide a better triggering effect.

Preferably, the pressing member 22 comprises a propped portion 222, which is disposed on a side of the pressing member 22 toward the waterproof member 23. Furthermore, the propped portion 222 corresponds in position to the switch element 211. In this embodiment, the propped portion 222 corresponds in position to the restoring structure 234 of the waterproof member 23 and to the pressing portion 235 of the waterproof member 23. When the pressing member 22 is pressed, the propped portion 222 exerts a force toward the switch element 211 on the pressing portion 235 of the restoring structure 234 such that the pressing portion 235 triggers the switch element 211. In some embodiments, the waterproof member 23 does not have the pressing portion 235, and the switch element 211 can be triggered by the propped portion 222 of the pressing member 22 applying force on both the waterproof member 23 and the switch element 211. In some embodiments, the pressing member 22 does not have the propped portion 222, and the switch element 211 is triggered directly by the waterproof member 23. The present disclosure is not limited thereto.

Moreover, the present disclosure also provides a button module, which is applied to an electronic device. The electronic device comprises a casing. The button module comprises a circuit board, a pressing member, a waterproof member and a reinforced member. The structures of the casing and the connective relationships between the casing and the button module can directly refer to the casing 10 of the electronic device 1 described in the above embodiments. Furthermore, the connective relationships between the circuit board, the pressing member, the waterproof member and the reinforced member and other structures thereof can be understood with direct reference to the button module 20, the circuit board 21, the pressing member 22, the waterproof member 23 and the reinforced member 24 described in the above embodiments and thus are, for the sake of brevity, not described again below.

As described above, according to the electronic device and the button module thereof of the present disclosure, the reinforced member is disposed on one surface (i.e., the second surface) of the waterproof member, and an edge of the pressing member corresponds to the reinforced member such that the reinforced member restricts the position of the pressing member when the pressing member is pressed. Even if the electronic device is damaged by an external force, such as the pressing member being peened, the reinforced member disposed between the pressing member and the circuit board will bear the downward stress from the pressing member so as to prevent the force from being applied to the fragile circuit board, thereby protecting the circuit board and the switch element thereof.

Although the present disclosure has been explained in relation to its preferred embodiments, it is to be understood that many other possible modifications and variations can be made without departing from the spirit and scope of the disclosure as hereinafter claimed.

What is claimed is:

1. A button module, applied to an electronic device comprising a casing having a mounting opening and a mounting groove, the mounting groove surrounding the mounting opening, the button module comprising:

a circuit board disposed in the casing and comprising a switch element;

a pressing member disposed on the mounting opening of the casing;

a waterproof member comprising a fixing flange and a first surface and a second surface opposite to each other, wherein the first surface faces the pressing member, the second surface faces the circuit board, and the fixing flange connects to the casing and is accommodated in the mounting groove;

a reinforced member disposed on the second surface of the waterproof member, wherein an edge of the pressing member corresponds to the reinforced member and the reinforced member comprises an opening corresponding to the switch element; and wherein the pressing member further comprises a limiting portion disposed on the edge of the pressing member, the limiting portion corresponds to the reinforced member, and the limiting portion abuts an inner edge of the mounting opening.

2. The button module as claimed in claim 1, wherein when the pressing member is pressed, the edge of the pressing member is restricted by the reinforced member.

3. The button module as claimed in claim 1, wherein a portion of the waterproof member passes through the opening and touches the switch element.

4. The button module as claimed in claim 1, wherein an orthographic projection area of the pressing member projected onto the reinforced member is less than an area of the reinforced member.

5. The button module as claimed in claim 1, wherein an outer surface of the pressing member is paralleled to the circuit board.

6. The button module as claimed in claim 1, wherein the reinforced member stops the limiting portion of the pressing member when the pressing member is pressed.

7. The button module as claimed in claim 1, wherein the pressing member further comprises a propped portion disposed on one side of the waterproof member facing toward the pressing member, and the propped portion corresponds to the switch element.

8. The button module as claimed in claim 1, wherein the fixing flange protrudes from the first surface.

9. The button module as claimed in claim 1, wherein the waterproof member further comprises a restoring structure, and the restoring structure protrudes toward the pressing member and is located inside the fixing flange.

10. The button module as claimed in claim 9, wherein the waterproof member further comprises a pressing portion disposed on the restoring structure and located on the second surface, and the pressing portion triggers the switch element when the pressing member is pressed.

11. The button module as claimed in claim 1, wherein the reinforced member further comprises a plurality of fixing portions connecting to the casing.

12. The button module as claimed in claim 11, wherein the fixing portions are symmetrically disposed on the reinforced member.

13. The button module as claimed in claim 11, wherein the casing further has a plurality of screw holes, the reinforced member is fixed to the casing by screwing the fixing portions into the screw holes of the casing.

14. An electronic device, comprising:

a casing comprising a mounting opening, a mounting groove and an inner surface, the mounting groove surrounding the mounting opening; and a button module comprising:

a circuit board disposed in the casing and comprising a switch element;

a pressing member disposed on the mounting opening;

a waterproof member comprising a fixing flange, and a first surface and a second surface opposite to each other, wherein the first surface faces the pressing member, the second surface faces the circuit board, and the fixing flange connects to the casing and is accommodated in the mounting groove; element; and wherein the pressing member further comprises a limiting portion disposed on the edge of the pressing member, the limiting portion corresponds to the reinforced member, and the limiting portion abuts an inner edge of the mounting opening a reinforced member disposed on the second surface of the waterproof member, wherein an edge of the pressing member corresponds to the reinforced member and the reinforced member comprises an opening corresponding to the switch element.

15. The electronic device as claimed in claim 14, wherein when the pressing member is pressed, the edge of the pressing member is restricted by the reinforced member.

16. The electronic device as claimed in claim 14, wherein an orthographic projection area of the pressing member projected onto the reinforced member is less than an area of the reinforced member.

17. The electronic device as claimed in claim 14, wherein the reinforced member stops the limiting portion of the pressing member when the pressing member is pressed.

18. The electronic device as claimed in claim 14, wherein the reinforced member further comprises a plurality of fixing portions connecting to the casing, and the fixing portions symmetrically are disposed on the reinforced member.

19. The electronic device as claimed in claim 14, wherein a portion of the waterproof member passes through the opening and touches the switch element when the pressing member is pressed.

20. The electronic device as claimed in claim 14, wherein the electronic device is a doorbell device.

* * * * *